(12) United States Patent
Old

(10) Patent No.: US 10,700,709 B1
(45) Date of Patent: Jun. 30, 2020

(54) LINEAR BLOCK CODE DECODING

(71) Applicant: Xilinx, Inc., San Jose, CA (US)

(72) Inventor: Gordon I. Old, Edinburgh (GB)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/965,271

(22) Filed: Apr. 27, 2018

(51) Int. Cl.
*H03M 13/13* (2006.01)
*G06F 5/06* (2006.01)
*H04L 1/00* (2006.01)

(52) U.S. Cl.
CPC .............. *H03M 13/13* (2013.01); *G06F 5/06* (2013.01); *H04L 1/0057* (2013.01)

(58) Field of Classification Search
CPC .................................................. H03M 13/11
USPC ........................................ 714/752, 755, 756
See application file for complete search history.

(56) References Cited

U.S. PATENT DOCUMENTS

| | | | | |
|---|---|---|---|---|
| 8,433,927 | B2* | 4/2013 | Plouffe, Jr. | ......... G06F 12/1458 380/255 |
| 2004/0125103 | A1* | 7/2004 | Kaufman | ................. G06T 15/06 345/419 |
| 2004/0143710 | A1* | 7/2004 | Walmsley | ............ B41J 2/04505 711/144 |
| 2004/0174570 | A1* | 9/2004 | Plunkett | ............... B41J 2/04505 358/3.13 |

OTHER PUBLICATIONS

Leroux, Camille et al., "A Semi-Parallel Sucessive-Cancellation Decoder for Polar Codes," IEEE Transactions om Signal Processing, Jan. 15, 2013, pp. 289-299, vol. 61, No. 2, IEEE, Piscataway, New Jersey, USA.
The 3rd Generation Partnership Project (3GPP), "Summary of Polar Code Design for Control Channels," 3GPP TSG RAN WG1 Ad-Hoc Meeting, R1-1700088, Agenda Item: 5.1.5.2.1, Jan. 16, 2017, pp. 1-10.

* cited by examiner

*Primary Examiner* — Fritz Alphonse
(74) *Attorney, Agent, or Firm* — Patterson + Sheridan, LLP

(57) ABSTRACT

Apparatus and method relates generally to data processing kernel. In such an apparatus, a datapath pipeline is configured to process datasets interlaced with respect to one another for multiple passes through a loop with conditional or data dependent decision points. A queue manager is configured with control circuitry sets to provide an instruction interface to the datapath pipeline. Each of the control circuitry sets includes: a first buffer and a second buffer each configured to buffer tokens for correspondence with the datasets. Each of the control circuitry sets further includes: an arbiter configured to decouple the conditional or data dependent decision points from the datapath pipeline to selectively provide access of the first buffer or the second buffer to the datapath functions. Memory is configured to provide access to and storage of the datasets to the datapath pipeline.

20 Claims, 10 Drawing Sheets

```
//─────────────────────
//Arbiter and queue logic ptr_tvalid;
logic ptr_tready;
cw_t ptr_tdata;

my_fifo #(
    .DEPTH(M)    //maximum number of interlaced codewords
)
PRT_CTL_I (
    .clk,
    .reset, .s_axis_tvalid(s_axis_tokenb_tvalid),
    .s_axis_tready(s_axis_tokenb_tready),
    .s_axis_tdata( s_axis_tokenb_tdata), .m_axis_tvalid(tokenb_tvalid),
    .m_axis_tready(tokenb_tready),
    .m_axis_tdata( tokenb_tdata )
);
always_comb begin : CTL_ARB_COMB
//priority given to token a over token b.

tokenb_tready           = 1'b0;            //default to prevent latch inference
    m_axis_tokenout_tdata   = '{default:0};   //default to prevent latch inference m_axis_tokenout_tvalid  = tokenb_tvalid | s_axis_tokena_tvalid;
    if (s_axis_tokena_tvalid) begin
        m_axis_tokenout_tdata = s_axis_tokena_tdata;
    end else begin //if no instruction from tokena then take one from the queue for token b
        if (tokenb_tvalid ) begin
            m_axis_tokenout_tdata = tokenb_tdata;
            tokenb_tready         = 1'b1;
        end
    end
end : CTL_ARB_COMB
    (c) 2017-18 Xilinx Incorporated
```

LINEAR BLOCK CODE DECODING

TECHNICAL FIELD

The following description relates to integrated circuit devices ("ICs"). More particularly, the following description relates to linear block code decoding for an IC.

BACKGROUND

Polar codes are linear block codes, which may be used as Forward Error Correction ("FEC") codes. Polar codes may have items in common with other linear block codes, such as Turbo codes or Low Density Parity Check ("LDPC") codes. A polar encoded codeword may be decoded with what is known as Successive Cancellation ("SC"). An enhancement to SC decoding is Successive Cancellation List ("SCL") decoding.

SUMMARY

An apparatus relates generally to a data processing kernel. In such an apparatus, a datapath pipeline is configured to process a plurality of datasets interlaced with respect to one another for multiple passes through a loop with conditional or data dependent decision points. A queue manager is configured with a plurality of control circuitry sets to provide an instruction interface to the datapath pipeline. Each of the plurality of control circuitry sets includes: a first buffer and a second buffer each configured to buffer a plurality of tokens for correspondence with the plurality of datasets. Each of the plurality of control circuitry sets further includes: an arbiter configured to decouple the conditional or data dependent decision points from the datapath pipeline to selectively provide access of the first buffer or the second buffer to the datapath functions. Memory is configured to provide access to and storage of the plurality of datasets to the datapath pipeline.

A method relates generally to processing data. In such a method, a plurality of tokens is queued in a queue manager of a data processing kernel configured in hardware for multiple passes through a loop for a datapath pipeline having datapath functions with conditional or data dependent decision points. A plurality of datasets corresponding to the plurality of tokens is loaded into memory of the data processing kernel. The plurality of tokens is selectively passed from the queue manager to the datapath pipeline of the data processing kernel as corresponding instructions. The selectively passing includes: arbitrating between a first buffer and a second buffer by an arbiter of a control circuitry set of a plurality of control circuitry sets of the queue manager with priority to decouple the conditional or data dependent decision points from the datapath pipeline by selective access of the first buffer or the second buffer to the datapath pipeline to allow each of the plurality of tokens to respectively pass for input to the datapath pipeline; performing the multiple passes through the loop in the datapath pipeline responsive to the instructions for the plurality of datasets interlaced in the data processing kernel; and outputting a processed version of each of the plurality of datasets.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 1-2 is a block diagram depicting another exemplary data processing kernel, such as for LLR processing.

FIG. 1-3 is a block diagram depicting yet another exemplary data processing kernel, such as for decoding for example.

FIG. 2-1 is a flow diagram depicting an exemplary data processing flow, such as a decoding flow for example.

FIG. 2-2 is a flow diagram depicting the exemplary decoding flow of FIG. 2-1 for the decoder of FIG. 1.

FIG. 3 is a block diagram depicting an exemplary communication system in which the decoder of FIG. 1 may be used.

FIG. 5 is a pseudocode listing depicting an exemplary arbiter and queue.

DETAILED DESCRIPTION

Figure 1:
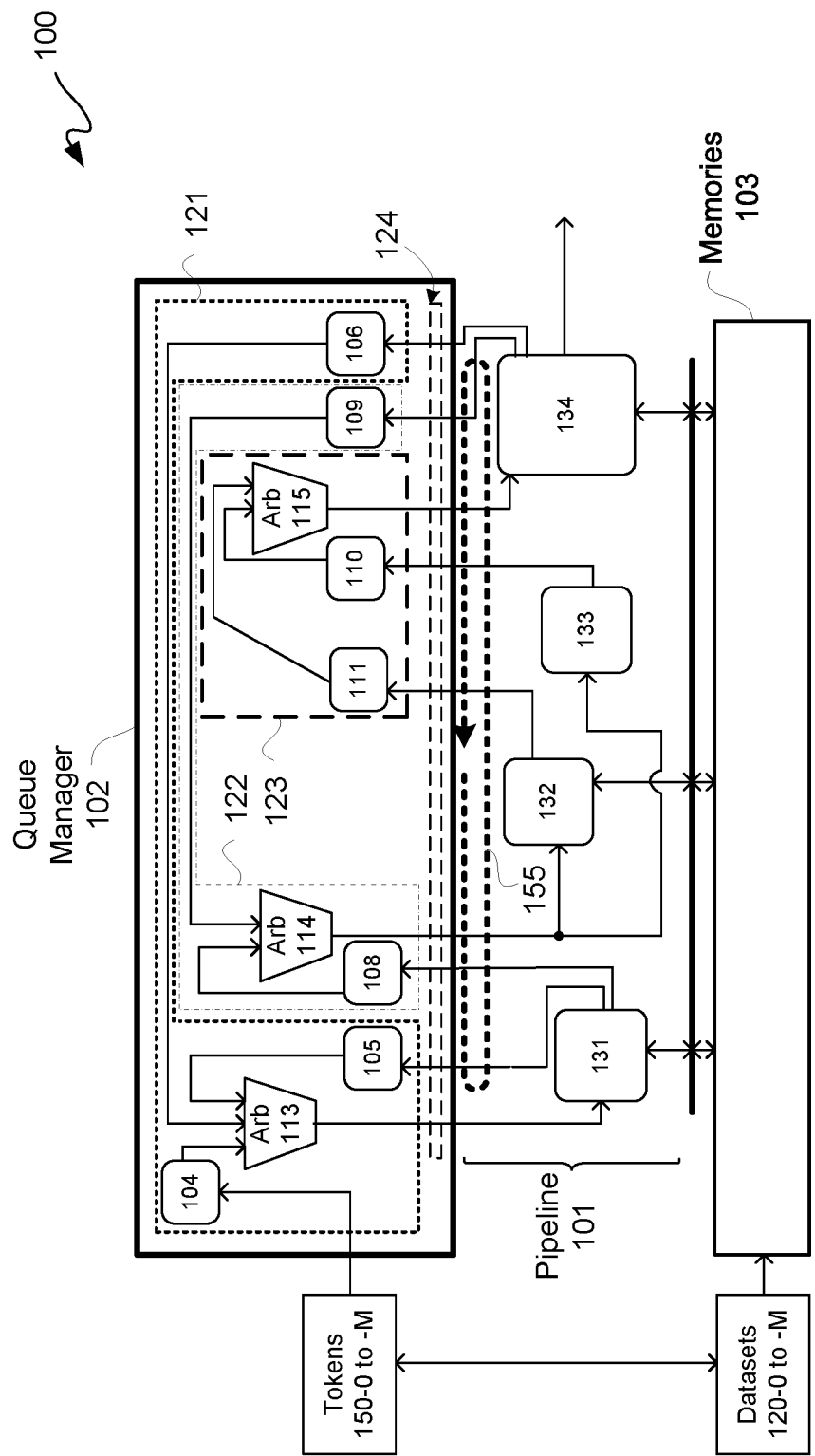
FIG. 1-1 is a block diagram depicting an exemplary data processing kernel.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

While SCL decoding of polar codes is described below, the following description is not limited to decoding polar codes but may likewise be applied to other types of successive decoding for other linear block codes. In polar decoding as well as other successive forms of decoding, a deterministic computation may be performed for each bit in turn of a decoded word, and each such per-bit computation may be performed only once for each successive bit. Moreover, even though the following description is for SCL pipelined decoding, the following description may likewise be applied to other successive pipelined decoding for channel decoding. Furthermore, the description for successive polar decoding is not limited to successive decoding of other linear block codes. For example, Turbo codes or Low Density Parity Check ("LDPC") codes, which are iteratively decoded as each considers an LLR in a codeword multiple times toward convergence to a result, may likewise be used. In contrast, in polar decoding a result for each bit is produced only once and not revised, as polar decoding is based upon looped passes of LLRs through a decoding algorithm. However, the following description may be useful to iterative, as well as successive, decoding, because in both iterative and successive decoding time to execute a single pass through a decoding algorithm may vary due to conditional branching and/or data dependencies. Furthermore, iterative or successive decoding may simply be difficult to compute and liable to change in development, and so a flexible management of processing interlaced codewords as described herein may reduce or save on a complex and brittle latency computation. In general, a data processing kernel, including a queue manager in particular, may be applied to any data processing involving multiple passes through a kernel loop having conditional or data dependent decisions.

An information bit vector (A), which is K bits long, may be allocated to positions within a vector (U) which is N bits long, where N is greater than K. The remaining N-K bits of vector (U) may each be set to 0, namely set to be "frozen". Vector (U) may thus be encoded to create a vector (X), also N bits long, which vector (X) may be transmitted as a codeword. Effectively, vector (A) is encoded into vector (X) for transmission as a codeword. Such a codeword may be sent over a channel for receipt by a receiver, and such a receiver may include an SCL decoder. Each bit of a received vector (Y), which is renamed from vector (X) as such a received vector (Y) may include channel noise, may have an estimated predetermined error probability, where a proportion thereof with a low error probability tends to capacity of an underlying channel, namely channel polarization. In polar codes, by using channel polarization, the most reliable K bits may be used to transmit information, and the remaining N-K bits for a code length N, namely less reliable bits according to channel polarization, may be set to a predetermined value, such as 0 for example. This setting of bits to such a predetermined value is known as "freezing" such bits, and a bit in such a state is referred to as a "frozen" bit.

For a received codeword (X), an SC decoder successively estimates a likelihood ratio ("LR") for each non-frozen bit, namely an "information bit," transmitted in a vector of bits from 0 to N-1. As is known, LR calculations may be simplified by using equivalent functions in a logarithmic domain, namely by using log-likelihood ratios ("LLRs"). Generally, an LLR is the probability of a received bit being a logic 1 divided by the probability of such received bit being a logic 0. A polar code decoder may be configured to decode each bit of a vector (U'), where vector (U') may be an estimate of vector (U), namely "soft" bits. Such a decoder may then pick out an original vector (A), as such decoder knows a-priori the size of K, N and the allocation of bits of vector (A) into vector (U).

Unfortunately, an SC decoder may have a low utilization rate among circuit resources as polar decoding is a successive-bit serial operation. In other words, in successive cancellation decoding, there may be a main processing loop which processes each bit of a codeword at a time successively and serially starting from bit 0 and proceeding to bit N-1. Additionally, some of these bits may have one or more data dependencies, such as data dependent decisions or "if statements" for example. In other words, "if statements" may conditionally delay processing. For example, if a decode algorithm, once implemented in hardware, takes n iterations, each of which takes p pipeline states, then we could interlace p codewords, each taking a slot in such pipeline. However, "if statements" due to one or more data dependent decisions may cause pipeline depth for such decoding of a single bit in a codeword to vary. An example of such variation may be passage through a decoding loop of a decoder. For example, this type of variable delay means that two separate codewords can complete a pass through a decoding loop and look to start a next pass through such a decoding loop at the same time. Assuming each of two codewords took a different fork in an if statement, such two codewords, respectively starting a decoding at a time index q and q+1, may respectively take p+1 and p decoding clock cycles. So both of such codewords may be ready to start a next pass through such a decoding loop at time index q+p+1, and this means a clash or collision may occur. Accordingly, not all functions of a datapath may be engaged at a time for decoding of a codeword, which results in a low utilization. Additionally, because SC polar decoding is a serial operation, this leads to high latency and low throughput. In SC polar decoding, if a bit is incorrectly decoded, there is no reexamination of such a bit in SC decoding, namely such a single bit error can result in an erroneously decoded codeword. To address such a single bit error limitation, SCL decoding was created.

In SCL decoding, when a decision point is reached for a bit, which may be either a 0 or a 1, both possibilities are examined. In effect, this is a "what if" bit u is a: 0, then what happens; and 1, then what happens. Therefore, even if an LLR indicates a bit 0 state, a bit 1 state is maintained as a possibility, and vice versa. So decoding continues with both possibilities, until a resolution based on results of such subsequent decoding using both possibilities can be determined.

Thus in SCL decoding, at each bit decision, two possibilities (called "paths") may be pursued, namely one path for each "what if" statement. This would produce $2^K$ paths for the most reliable K bits in polar coding, which is still a prohibitively large number for many applications. To be clear, the above-described "if statements" which may cause traffic clashes are not hypothetical values of 0 and 1 examined as "what if" statements in a by SCL polar code decoder. Rather, each "what if" statement is caused by the type of bit being decoded, namely whether such bit is an information bit or a frozen bit. Along those lines, an information bit causes a list size to increase; however, a frozen bit does not cause a list size to increase, as described below in additional detail by way of example and not limitation. As such, a sorter may be used only for processing information bits and may be bypassed for processing frozen bits, such as to reduce latency. However, because of such two possible different decoding paths for frozen and information bits, the possibility of a traffic clash or collision is introduced as between processing information and frozen bits.

To reduce the number of paths in SCL decoding, each path is attributed a figure of merit called a path metric, which may be based upon an LLR value at a decision point for such an information bit. Once the number of paths reaches a limit called a list size ("L") in SCL decoding, the list of path metrics is sorted and only the best L paths survive for further processing. Thus, the L paths with the L highest LLR values survive. For example, suppose L is equal to 8 and presently there are 8 paths currently being used in an SCL decoding, if a next bit to be decoded is an information bit, then the number of paths would be doubled, namely from 8 to 16. Thus, 8 of these 16 paths may be culled to reduce the number of paths back down to 8 using LLRs associated with soft bits, namely bit probabilities for 0 and/or 1, for such paths. Such culled paths are discarded. Path metrics are sorted and culled only for information bits, not for frozen bits. Frozen bits are not processed for a sort operation in SCL decoding.

Furthermore, for SCL decoding, the order of operations is determined partly by code definition, since a sort and possibly cull operation only occurs after information bits are encountered. Also, in polar decoding, the number of layers of processing for partial sum calculations or LLR calculations depends upon the index of a bit in a codeword being decoded. Assuming that partial sum and/or LLR calculations are pipelined, this can lead to a variable latency for each of these operations.

Interlacing/interleaving ("interlacing") of codewords through hardware data functions is a conventionally applied technique to achieve higher throughput and higher utilization of hardware, but data-dependent factors of polar decoding pose a challenge for such conventional interlacing. Two conventional types of interlacing are: fixed-position "carousels" or fixed-position "slots" or "seats," where a codeword is allocated one of N slots for a fixed position in a datapath; or "precomputed" scheduling, where the delay for a codeword through a datapath function is calculated so that its input to the next function in such a datapath may be predetermined and scheduled. There are limitations associated with each of these types of interlacing, which are described in additional detail below with respect to SCL polar decoding operations.

As described below in additional detail, SCL decoding may be performed by adding a queue manager to an SCL datapath pipeline. By using tokens to pass as instructions to proceed, decoding operations may be performed on codewords, including in-process versions thereof, interlaced in a datapath pipeline of a decoder to increase utilization of circuit resources thereof, as well as one or more other features.

With the above general understanding borne in mind, various configurations for SCL polar decoding are generally described below.

FIG. 1-1 is a block diagram depicting an exemplary data processing kernel 100. While a data processing kernel 100 implemented in hardware is described for the application of decoding linear block encoded codewords, other applications of such a data processing kernel 100 may be used. Along those lines, data processing kernel 100 may be used in any application involving multiple passes through a kernel loop ("loop") 155 with conditional or data dependent decision points.

Datapath pipeline 101 may be configured to process a plurality of datasets 120 interlaced with respect to one another for multiple passes through a loop 155. Datapath pipeline 155 may have having datapath circuit functions 131-134 for example, where one or more of same are associated with conditional or data dependent decision points.

Queue manager 102 may be configured with a plurality of control circuitry sets such as 121-123 for example to provide an instruction interface 124 to datapath pipeline 101. Each of such plurality of control circuitry sets may include a first buffer and a second buffer, such as from buffers 104-106, and 108-111, where each may be configured to buffer a plurality of tokens 150 corresponding to such plurality of datasets 150. Each of such plurality of control circuitry sets may include an arbiter, such as of arbiters 113-115, configured to decouple conditional or data dependent decision points from datapath pipeline 101 to selectively provide access of at least a first or second buffer to an associated datapath function of such datapath functions. Memory 103 may be configured to provide access to and storage of such plurality of datasets to such datapath functions.

For example, with reference to a first control set 121, buffers 104-105 feed an arbiter 113, and arbiter 113 provides access to datapath function 131. Similarly, for example, with reference to a second control set 122, buffers 108 and 109 feed an arbiter 114, and arbiter 114 provides access to datapath functions 132 and 133. Lastly, for example, with reference to a third control set 123, buffers 110 and 111 feed an arbiter 115, and arbiter 115 provides access to datapath function 134. Datapath functions 131, 132, and 134 in this example are coupled to memory 103, and datapath function 133 is not coupled to memory.

While some datapath functions may be coupled to memory 103, other datapath functions of a datapath pipeline 101 may not be coupled to memory 103. Furthermore, an arbiter may feed one or more datapath functions of a datapath pipeline 101.

Outputs from such datapath functions may feed buffers of queue manager 102. For example, output of datapath function 131 feeds buffer 108; output of datapath function 132 feeds buffer 111; output of datapath function 133 feeds buffer 110; and output of datapath function 134 feeds buffers 106 and 109. A last datapath function, such as datapath function 134 for example, of a datapath pipeline 101 may additionally provide an output from such datapath pipeline.

Figures 1, 2:
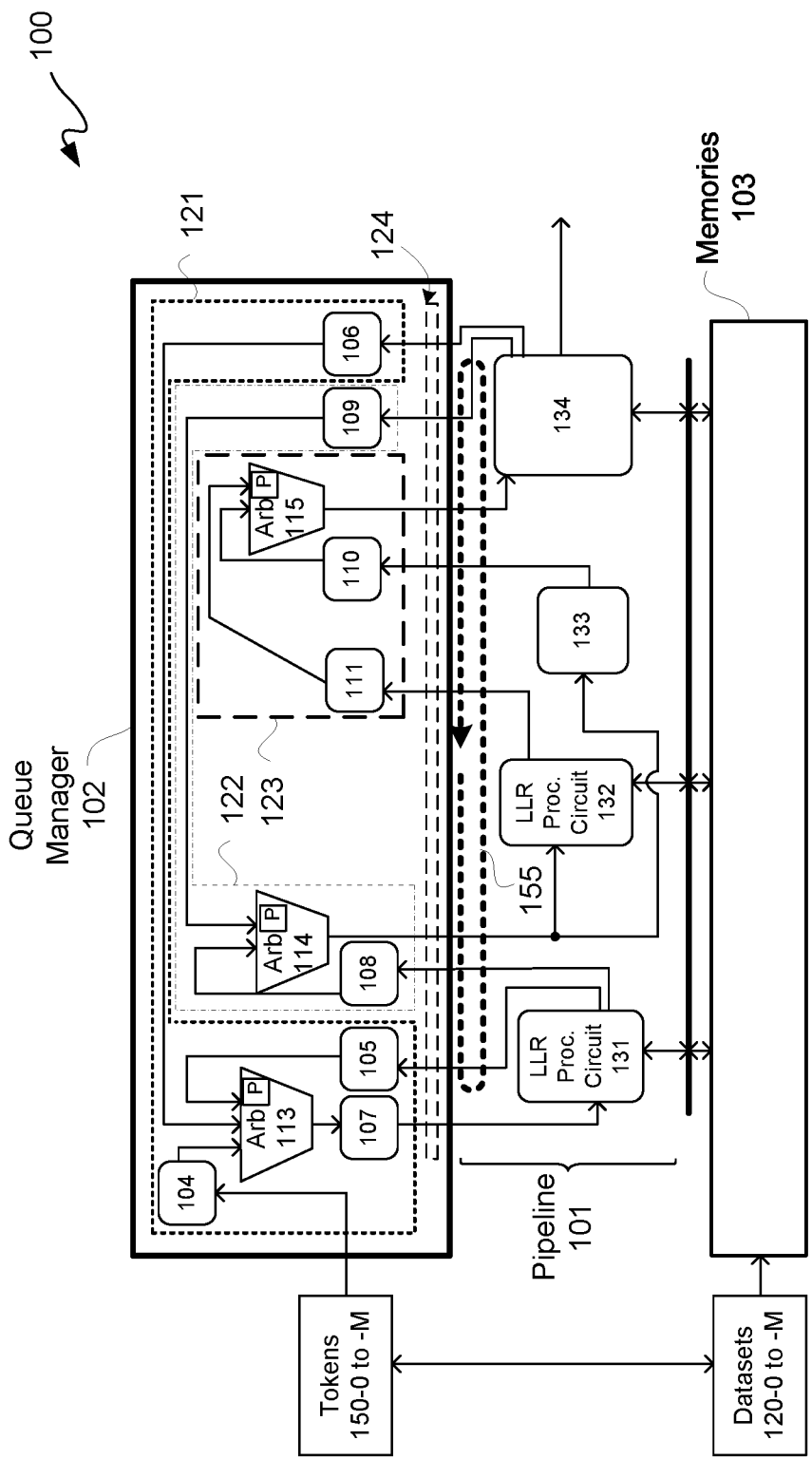

FIG. 1-2 is a block diagram depicting another exemplary data processing kernel 100, such as for LLR processing. Data processing kernel 100 of FIG. 2 is the same as data processing kernel 100 of FIG. 1-1, except for the following differences. In this example, datapath functions 131 and 132 of datapath circuit functions 131-134 may include a first log-likelihood ratio ("LLR") processing circuit 131 and a second LLR processing circuit 132. A first control circuitry set 121 of such plurality of control circuitry sets 121-123 may be configured for providing input serially to such first LLR processing circuit 131. A second control circuitry set 122 of such plurality of control circuitry sets 121-123 may be configured for providing input in parallel to such second LLR processing circuit 132. For purposes of clarity and not limitation, single lines are depicted for either serial or parallel propagation of information.

Each of a plurality of tokens 150 may be a unique instance within datapath pipeline 101 for a one-to-one correspondences with datasets 120. Each arbiter 113-115 respectively of such plurality of control circuitry sets 121-123 may be configured with a priority parameter, P. Priority parameters, P, may be same and/or different among arbiters 113-115.

Figures 1, 2, 3:
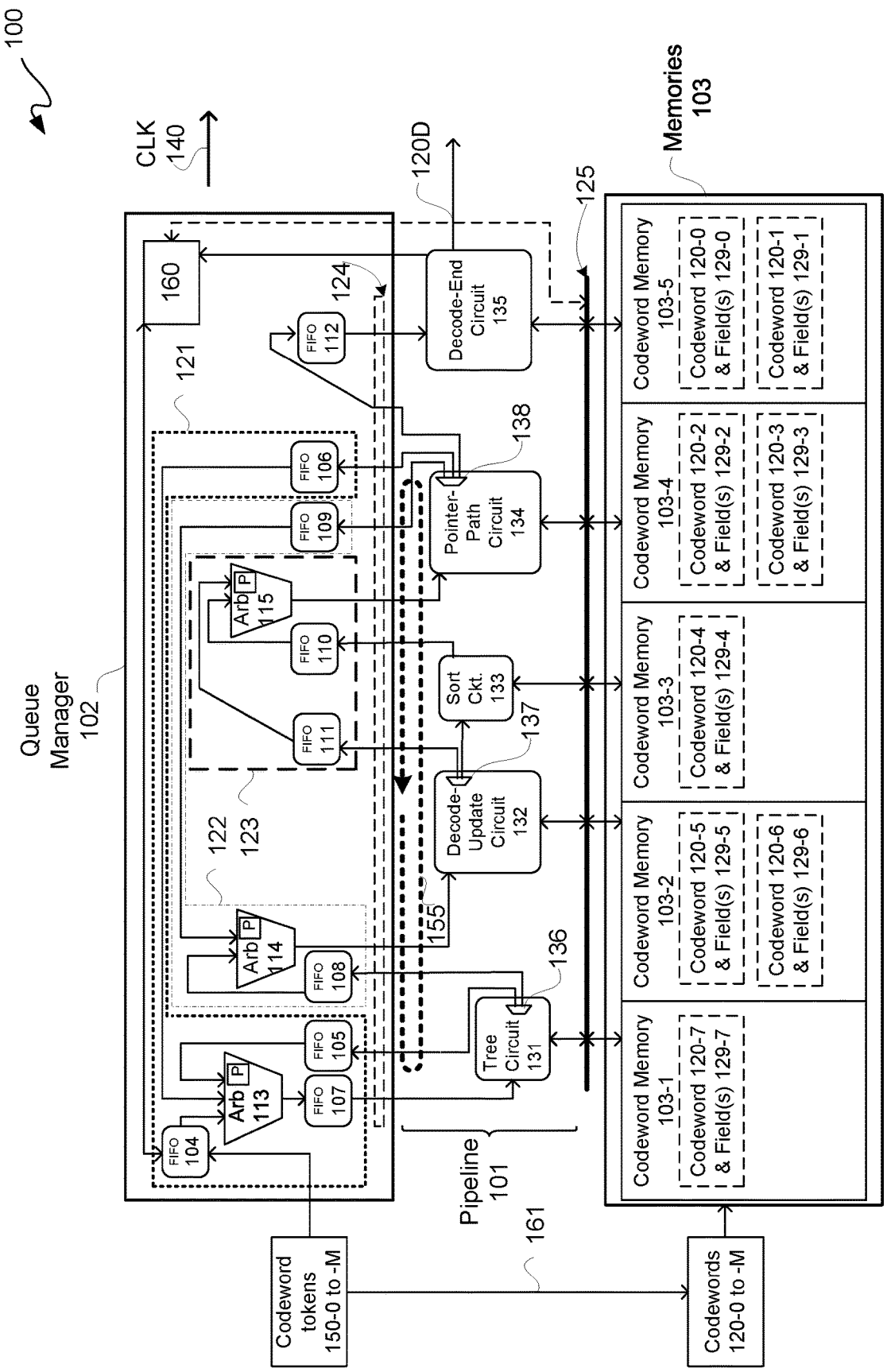
Figures 1, 2:
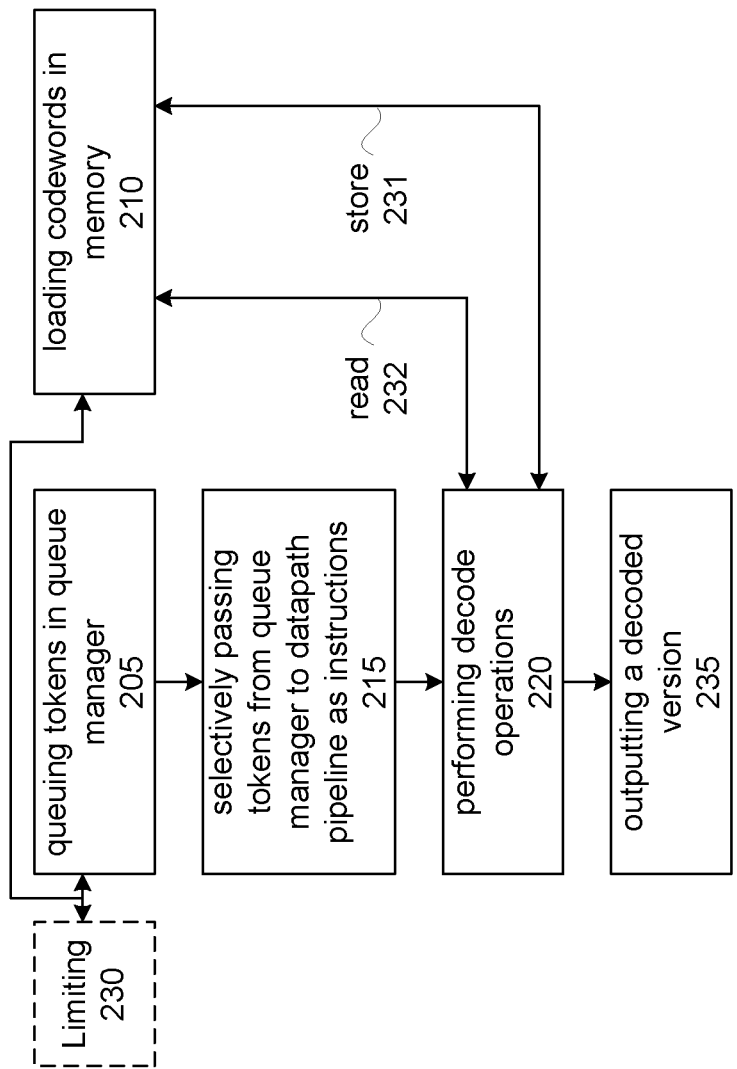
Figure 2:
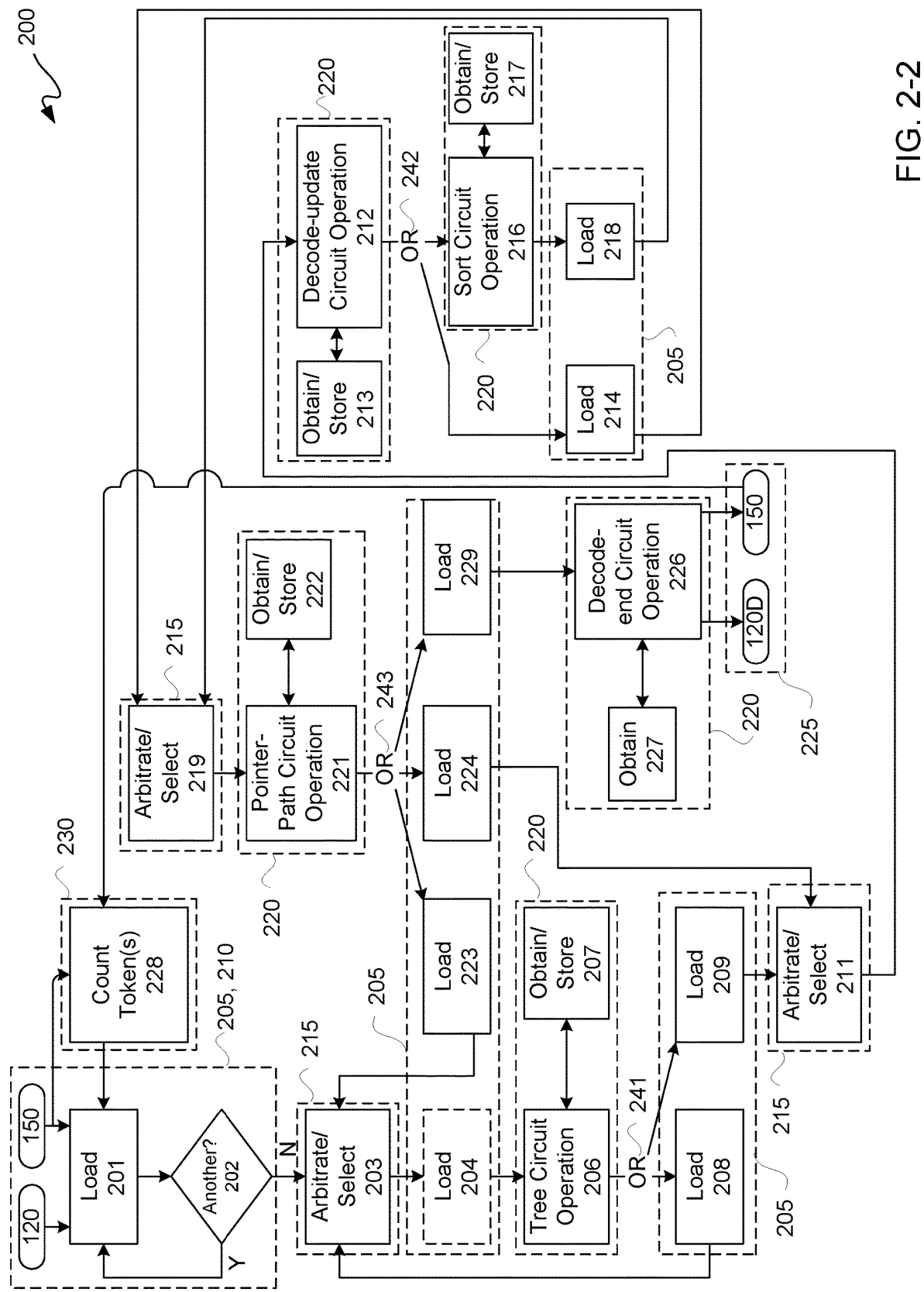
Figure 3:
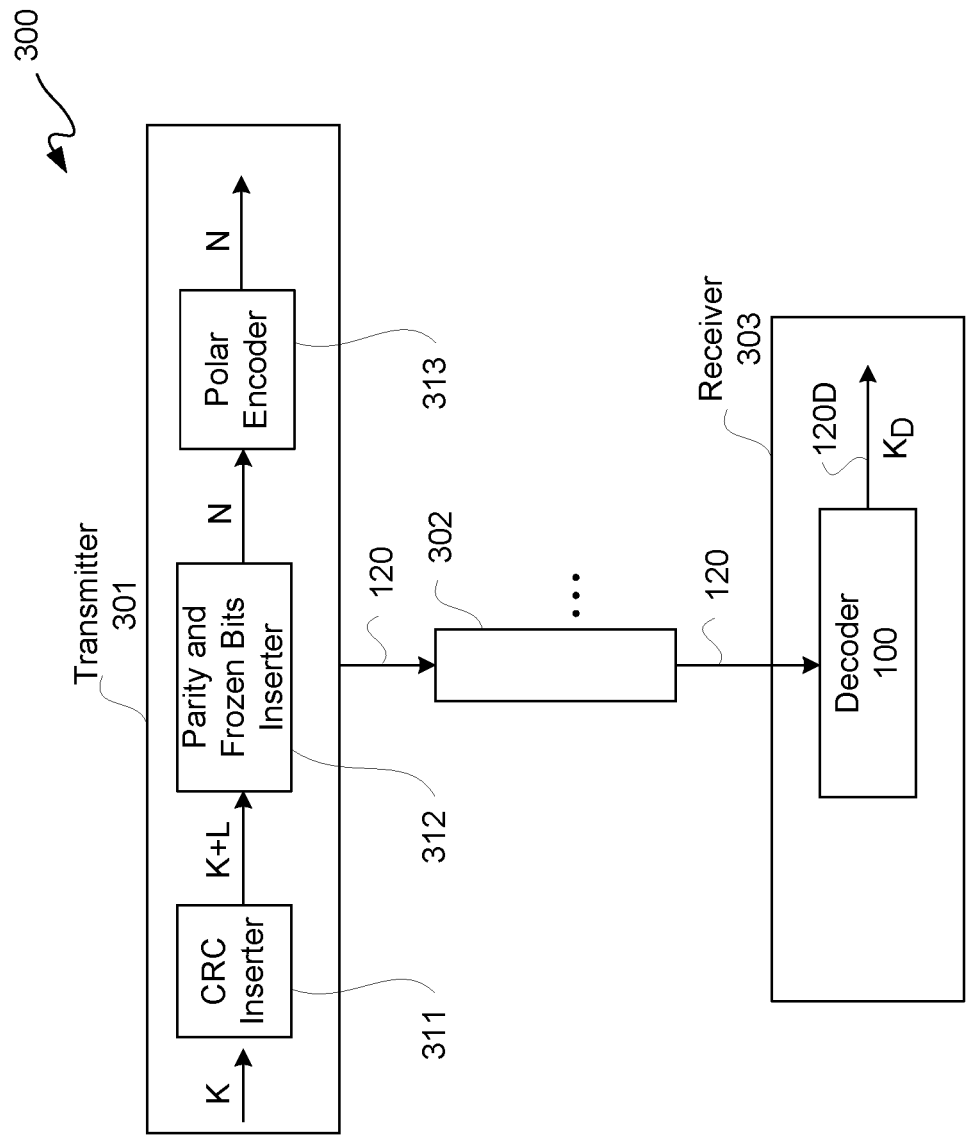

FIG. 1-3 is a block diagram depicting yet another exemplary data processing kernel 100, such as for decoding for example. For purposes of clarity by way of example and not limitation, data processing kernel 100 is described as a decoder 100 for decoding, even though data processing kernel 100 may be used in contexts other than decoding. Decoder 100 includes a datapath pipeline 101, a queue manager 102, and a memory or memories 103. In this example, datapath pipeline 101 may include circuits 131-135, as described below in additional detail. Queue manager 102 may include first-in, first-out buffers ("FIFOs") FIFOs 104-112 and arbiters 113-115, as described below in additional detail. FIFOs 104-112 may be conventional FIFOs, where an associated arbiter may assert a read_enable signal to a FIFO in order to have data appear at a data output port of such FIFO.

Memory 103 may include a plurality of random access memories and/or a plurality of register memories ("memories") 103-1 through 103-5. Though a single memory with multiple read and write ports may be used, the number of read and write ports may be increased by using multiple memories in order to increase throughput. Moreover, for a SoC, such as an FPGA for example, with multiple memories distributed over an area, spatial locality as between datapath functions and associated memories may be used to reduce propagation delay. Additionally, as temporal locality may exist between a memory and an associated datapath function, because each time a datapath function is accessed corresponding memory may be accessed.

Codeword tokens 150 having a one-to-one correspondence with codewords 120 may be input to an input buffer, such as a first-in, first-out buffer ("FIFO") 104, of queue manager 102. Again, even though codewords 120 and codeword tokens 150 are described for purposes of clarity by way of example, more generally datasets 120 with dataset tokens 150 may be processed, including multiple passes through a loop 155 having conditional or data dependent decision points therein. Codewords 120 may be input to memory 103, such as for example codeword memory 103-1, at the same time corresponding tokens 150 are piped or otherwise loaded into FIFO 104. Decoder 100 may operate off of a single clock signal 140 provided to circuits thereof. Codewords 120 may represent groupings of linear block encoded bits. Codewords 120 may be decoded by a successive decoding by decoder 100.

Codeword tokens 150 and corresponding codewords 120 may be input to FIFO 104 and memory 103, respectively, one at a time responsive to a clock signal, generally indicated as a global clock signal 140. Codeword tokens 150 and codewords 120 may be input in bit-parallel, rather than bit-serial, as such input does not involve bit-by-bit processing for SCL at this time. Moreover, even though single lines are shown for signal lines for purposes of clarity, such single lines may represent single or multiple line signal busses.

There may be a maximum interlaced number limit M ("limit M") as to how many codewords 120 may be in decoder 100 at a time for concurrent or interlaced pipelined processing thereof. For purposes of clarity by way of example and not limitation, it shall be assumed that limit M is equal to 8 for a maximum of 8 codewords 120 for concurrent pipelined processing thereof in decoder 100 at one time. However, in other examples fewer or more than 8 codewords 120 may be concurrently processed in a decoder 100.

Furthermore, control for limit M may be optional depending on application. For example, if decoder 100 is equal or faster at outputting decoded versions of codewords 120, namely decoded codewords 120D, than such codewords 120 are available for feeding into decoder 100, then control for limit M may be omitted. However, for purposes of clarity and not limitation, controlling for limit M shall be assumed.

Generally, polar codes are configurable and can be used on a block-by-block basis. A "block" is a general term used for "an atomic unit" of data, such as may be processed by an encoder or a decoder. A codeword is a form of an encoded block, which in this example is a polar encoded block.

A codeword 120, as represented by a codeword token 150 in queue manager 102, may be only in one place in a decode cycle of decoder 100. For example, a codeword 120, which may be represented by a codeword token 150, may be either in a single queue or a single datapath function, such as datapath functions corresponding to datapath circuits 131 through 135. In other words, for tokens 150 in decoder 100 at a time, there is only one unique instance of each such token 150 within datapath pipeline 101 and the queue manager 102 at a time for pipelined decoding of codewords 120 currently in-flight in such datapath pipeline.

Because a codeword 120 or associated tokens 150 can only be in one place at a time, the maximum depth of a queue, namely in any of FIFOs 104-112, may be set to limit M, a positive integer greater than one, which in this example limit M is equal to 8. Thus, the number of codewords 120 or associated tokens 150 in decoder 100 at a time may not be more than limit M, which is 8 for this example. In other words, limit M is the number of codewords 120 that may be interlaced at one time in decoder 100.

A memory bus 125 may be configured for moving a codeword 120 from one to another of memories 103 corresponding to processing thereof. Datapath functions may provide instructions for reading and writing codewords to and from memories, as described below in additional detail. Some examples of possible locations of codewords 120-0 through 120-(M−1) for limit M equal to 8 are provided with dashed boxes in memories 103 for purposes of clarity by way of example and not limitation. Decoder 100 is configured as a semi-parallel SCL decoder with datapath functions of datapath pipeline 101 and corresponding instruction paths. Data paths between memories 103 and datapath functions, as well as from memory-to-memory, are not shown in unnecessary detail for purposes of clarity and not limitation. However, codewords 120 stored in memories 103 may be processed though decoder 100 as described below in additional detail.

For a datapath pipeline 101 configured to process a plurality of codewords 120 for SCL decoding, such datapath pipeline 101 may include a partial sum and LLR processing circuit ("tree circuit") 131, a partial sum and parallel LLR processing circuit and path metric update circuit ("decode-update circuit") 132, a sort circuit 133, a pointer update and path update circuit ("pointer-path circuit") 134, and an end of decode processing circuit ("decode-end circuit") 135. Some apparently disparate functions have been combined into a single circuit where one function follows another function with no conditions and without any traffic back-pressure between such two functions. For example for each LLR processing operations, partial sums are used. Partial sums may be computed and used immediately by LLR processing at the same rate as such partial sums are produced. Also, LLR processing occurs in two places because of a semi-parallel configuration of an SCL decoder. In other words, high rank processing occurs seldom, but involves many more LLRs in parallel to be considered, whereas low rank processing occurs often, but involves considering far fewer LLRs. To increase resource utilization or circuit efficiency, an SCL decoder may be configured to operate serially at high ranks and in parallel at low ranks. For example, if 8 paths are in a list, each path may be computed in turn at high ranks, and all paths together may be computed at low ranks. In decoder 100, conventional low and high rank processing as described above is used for low and medium rank processing respectively, and high ranks are processed as a list-serial and also iteratively, namely an LLR vector is handled in chunks rather than all together.

These and/or other circuits for implementing functions for polar decoding may be used. Again, polar code decoding ("polar decoding") is used for purposes of example and not limitation, as other linear block codes may be used.

Tree circuit 131 in this example is a serial tree circuit, namely for serial input of tokens and corresponding datasets, configured for high-rank LLR processing. Decode-update circuit 132 in this example is a parallel tree, namely for parallel input of tokens and corresponding datasets, for low-rank processing (i.e., decoding), which includes path metric processing. Sort circuit 133 in this example is a sorter and a pointer update circuit which also calculates path bits. Pointer-path circuit 134 may be a pointer and path update circuit for SCL decoding. Decode-end circuit 135 may be a conventional SCL final stage decode circuit.

Traffic jams, as well as traffic collisions, may occur. For example, decode-update circuit 132 and sort circuit 133 may both be "fully pipelined," namely may be configured to process an entire codeword 120 on each decode clock cycle. In contrast, tree circuit 131 and decode-end circuit 135 may each not be fully pipelined, namely may be configured to process an entire codeword 120 on more than one decode clock cycle. Accordingly, FIFOs 107 and 112 may be respective input buffers to tree circuit 131 and decode-end circuit 135 to compensate for such one or more additional clock cycles for processing codewords, namely for taking more clock cycles than either or both of decode-update circuit 132 and sort circuit 133. While a traffic jam may occur with multiple tokens 150 queued up in FIFO 107 or 112, by having a limit on codewords equal to depth of buffers, even traffic in either of FIFOs 107 and 112 cannot reach an overflow state.

However, whether or not a datapath pipeline 101 functional circuit is fully pipelined or not, queue manager 102 manages throughput. Moreover, queue manager 102 is scalable with pipeline depth. Accordingly, queue manager 102 may be used to manage processing of codewords for SCL decoding or another type of successive decoding. Furthermore, queue manager 102 may be agnostic to the type of linear block code being decoded, and so any linear block code that is successively decoded may be used.

Queue manager 102, and thus an instruction interface 124 by way of tokens to datapath pipeline 101, may be interfaced to datapath pipeline 101 with addition of token handling as described herein. However, other internal circuitry related to SCL decoding circuits 131 through 135 may be conventional, and memories 103 and memory bus 125 may be conventional. Accordingly, generally the following description avoids unnecessary description of a conventional SCL datapath pipeline 101 and memories 103 for purposes of clarity and not limitation.

In an SCL decoder, each bit of a block to be decoded is decoded in series, using the results of previously decoded bits to help decode subsequent bits. For each bit, datapath functions performed may differ depending on whether the bit in question is a frozen bit or an information bit. Moreover, such datapath functions performed may differ if a bit is a parity bit if some form of augmented SCL coding is being used. However, for purposes of clarity and not limitation, it shall be assumed that only information and frozen bits are present in SCL decoding.

For SCL decoding, if a current bit in decoder 100 is a frozen bit, then an LLR calculation may be followed by a path metric update and then a psum calculation before beginning a decode of a next bit. However if a current bit in question is an information bit, then an LLR calculation may be followed by a path metric update, a sort, a pointer manipulation, and a psum calculation before beginning a decode of such a next bit. Furthermore, LLR and psum calculations are performed over a number of ranks of a decode trellis, as well as an SCL encode trellis, depending on an index of a bit being decoded. If LLR and/or psum calculations are pipelined, then having different paths for frozen and information bits leads to having variable latency as to when such calculations may be performed. This variable latency may be addressed and substantially reduced in complexity by queue manager 102.

A combination of variable latency and variable order-of-execution makes the control of such a datapath complex. A controller which is to issue a command to a datapath function for a codeword is to know how long each datapath function may take to execute (i.e., latency) and is to take into account a code definition to determine which datapath function to activate next. If, during design, latency of a datapath function should change, this change is to be reflected in calculations performed by such a controller, making design of an SCL decoding system sensitive to changes in latency which may occur during timing closure. This complexity may be addressed and substantially reduced by queue manager 102.

Further, it should be noted that the above description applies to a single codeword. To increase throughput, conventionally several codewords are interlaced in such a datapath. However, variable latency and variable order of execution leads to an additional hazard in interlaced codeword processing, namely collisions. If, for instance, a codeword completes a path metric update of a frozen bit at the same moment as another codeword completes an update of pointers for a non-frozen bit, then both codewords may contend to start an LLR calculation on the following cycle. This adds a further complication to a controller in that it now has to model and cope with traffic collisions. This complexity may be addressed and substantially reduced by queue manager 102.

In polar decoding, high ranks are included in computations relatively seldom compared to low ranks, so high rank processing may be executed in a serial fashion to save on resources. Along those lines, SCL datapath functions executing on high ranks may not be able to accept a new codeword on each new cycle if serial circuitry is used to save on resources. This may add another complication to controller design. This complexity may be addressed and substantially reduced by queue manager 102.

Addition of queue manager 102 provides a system of control which copes with one or more of the above-described control complications in a flexible manner, allowing for high resource utilization and adaptability should latency of an individual datapath function change. In decoder 100, there is no centralized controller present, but instead each datapath function is issued or issues an instruction, such as to a next datapath function, for a current codeword being processed using tokens. In other words, an instruction itself may be no more than an identifier or token for such current codeword sufficient to differentiate each presently interlaced codeword being processed in decoder 100.

Along those lines, after each decoded codeword 120D exits datapath pipeline 101 from decode-end circuit 135, a corresponding token 150 for each such exited decoded codeword 120D may be returned to an up/down counter ("U/D") 160 or other control circuitry of queue manager 102. Such returned tokens 150 may be used for limiting the number of codewords 120 in decoder 100 at one time.

Up/down counter 160 may be in communication with FIFO 104 to receive a token 150 to indicate buffering of a codeword 120, and to control readiness of FIFO 104 to receive a codeword 120. Along those lines, up/down counter 160 may be configured to count up to limit M responsive to loads into FIFO 104, before holding FIFO 104 in a state of not accepting another codeword when a net limit M loads are reached and to count down from a current count responsive to each codeword token 150 returned from decode-end circuit 135. Circuitry to synchronize loading of codewords 120 contemporaneously, such as synchronously for example, with queuing of tokens 150 is generally indicated with arrow 161 for purposes of clarity and not limitation.

While an up-down counter 160 may be used, in another example, optionally a scheduler 160 may be used, where such scheduler 160 may optionally be configured for receiving returned tokens 150 and for communication with memory 103 via memory bus 125 to schedule allocation of slots, including initial allocation, based on received codewords 120. For example, a decoder 100 may be configured to receive codewords 120 of different lengths and/or different numbers of information bits. Because of such variation among codewords 120, such codewords 120 can complete in a different order with respect to an order in which such codewords 120 entered decoder 100. Because each in-flight codeword 120 may be allocated in memory of memories 103, such as in each of datapath RAMs for example, when a token 150 is returned, such returned token 150 may be associated with a slot in each such allocated memory. A vector of M slots, such as 8 slots continuing the example herein, which may initially be allocated in order 0 to 7, but, as decoding proceeds and codewords complete, tokens 150 returned for such allocated slots may complete out of such order or sequence. Scheduler 160 may keep track of such order of execution of such tokens using for example a bit-vector or "scoreboard" with one bit per slot. Such a bit-vector may be M bits long, where a logic 1 indicates a corresponding slot is current occupied or taken by an in-flight codeword 120 in decoder 120, and where a logic 0 indicates a corresponding slot is currently available to accept another codeword 120 input to decoder 100. Along those lines, in-flight codewords 120, or associated tokens 150, may be checked or "scoreboarded" according to occupancy and availability. Hence, on completion of decoding a codeword 120D, an associated slot may be freed up and so may be re-allocated to a new incoming codeword 120.

Each instruction or token 150 may be passed from one datapath function to a next datapath function via a queue, which in this example may be a FIFO implemented in RAM or register memory. FIFOs may be used to address variable latency issues, as well as address a datapath function which cannot accept a new instruction on a current clock cycle, such as for example on each new clock.

For traffic collisions, arbiters 113 through 115 may be used to service one of multiple incoming queues to each datapath function. Such an arbiter may pass an instruction from a queue to a datapath function if such datapath function is ready to receive a new instruction and without arbitration if only one queue had such an instruction.

In the event that more than one queue to a datapath function has an instruction, then such arbiter chooses one. A queue not selected may retain such an instruction until such time as such arbiter chooses to service that queue in a later decoding clock cycle. Priority as to which instruction to service first, such as whether a first-in-time priority, a further along in processing priority, and/or other priority, may be configured into arbiters 113 through 115. Moreover, such arbiters 113 through 115 may, though need not, all have the same order of priority.

FIG. 2-1 is a flow diagram depicting an exemplary data processing flow 200, such as a decoding flow 200 for example. At operation 205, a plurality of tokens may be pipeline queued in a queue manager of a data processing kernel 100, such as for example a decoder. Contemporaneously, such as synchronously for example, with operation 205, operation 210 may be used to pipeline load a plurality of datasets, such as a plurality of codewords, corresponding to such plurality of tokens into memory of such data processing kernel, such as a decoder. Optionally, at operation 230, a number of tokens queued, and consequently a number of datasets, such as codewords, loaded, may be limited to a maximum number.

With continuing reference to operations 205 and 210, at operation 215, such plurality of tokens may be selectively passed from such a queue manager to a datapath pipeline of such a data processing kernel, such as a decoder, as instructions. At operation 220, decode operations may be performed in such a datapath pipeline responsive to such instructions for such plurality of codewords interlaced in such decoder. Again, more generally, operation 220 may include multiple passes through a loop 155 having conditional or data dependent decision point. However, for purpose of clarity by way of example and not limitation, decoding operations are further described. These decode operations may include reading at 232 such plurality of codewords, including in-process versions thereof, from such memory for such decoding, or more generally data processing. Moreover, such decode operations may include storing at 231 such in-process versions of such codewords, or more generally datasets, in such memory. At operation 235, a decoded version of each of a plurality of pipelined-interlaced codewords may be output. Again, more generally, a data processed version of each dataset of a plurality of pipelined-interlaced datasets may be output.

FIG. 2-2 is a flow diagram depicting the exemplary decoding flow 200 of FIG. 2-1 for decoder 100 of FIG. 1. Singly and collectively FIGS. 2-1 and 2-2 are referred to hereinafter as FIG. 2. For purposes of clarity by way of example and not limitation, with the above-description borne in mind, operation of decoder 100 and decoding flow 200 are further described with simultaneous reference to FIGS. 1 and 2.

At operation 201, a codeword token 150 may be piped or otherwise loaded into an input FIFO 104 as an example of a part of operation 205, and a corresponding codeword 120 may be piped or otherwise loaded or written into memory 103 as an example of operation 210. A count of each token 150 loaded may be made at count operation 228 to control load operation 201 as an example of operation 230.

Using the example of a stack of limit M codewords 120 to process, namely codewords 120-0 through 120-M, there may be a corresponding limit M codeword tokens 150-0 through 150-M. Generally, a codeword 120 and a corresponding codeword token 150 are used throughout the description below to indicate only one of each of same in decoder 100 at a time. However, in some instances, examples are provided for purposes of clarity and not limitation, and there may be more than one token and codeword in decoder 100 at a time.

Each codeword token 150 may be loaded into input FIFO 104 on successive clock cycles 161 of clock signal 140 as determined at operation 202, until all codewords 120, which may be codewords 120-0 through 120-7 in this example, are loaded at least initially into memory 103-1 corresponding to codeword tokens 150-0 through 150-7 input in FIFO 104 of decoder 100 at load operation 201. A check for another codeword to load at operation 202 may be based on whether there is another codeword 120 to input into decoder 100, as well as whether decoder 120 currently has a limit M of interlaced codewords present in such decoder, as determined at count of token(s) operation 228, such as may be performed by up/down counter 160. Accordingly, operations 201 and 202 may be examples for operations 205 and 210, as generally indicated with a dashed box. Moreover, load operation 201 pertaining to tokens 150, as well as load operations 204, 208, 209, 214, 218, 223, 224, and 225, are examples of possible parts of operation 205.

FIFOs 104-107 are for a control circuitry set 121 of buffers, where such control circuitry set 121 further includes an arbiter 113. Control circuitry set 121 in this example is for a tree circuit 131 of datapath pipeline 101. Along those lines, FIFOs 104 through 112 may be clocked for pipelined operation for instruction interface 124 of queue manager 102 to and from datapath pipeline 101.

Arbiter 113 may be configured to arbitrate among outputs, if any, ready for output from FIFOs 104-106 of control circuitry set 121. At arbitrate or select ("select") operation 203, a codeword token 150 corresponding to a codeword 120, such as a token 150-0 for codeword 120-0 for example, may be ready to be read or clocked out of FIFO 104 for input to arbiter 113. Likewise, a token 150 ready for output from FIFO 105, if any present, and a different token 150 ready for output from FIFO 106, if any present, may each be ready to be read or clocked respectively out of those FIFOs.

At select operation 203, a codeword token 150 from FIFO 104, or a codeword token 150 respectively ready for output from FIFOs 105 and 106, may be selected for output from arbiter 113 for input to FIFO 107. FIFO 107 may be optional to provide another buffer for input to tree circuit 131. Select operations 203, 211 and 219 are examples of possible parts of operation 215.

An arbiter, such as arbiters 113-115, may only service one associated incoming queue of associated incoming queues at a time. For arbiters 114 and 115, such servicing of an incoming queue is dependent in part upon an associated receiving datapath function being ready to receive an instruction, else all incoming queues are held pending. In this example, FIFO 107 buffers input to tree circuit 131, and arbiters 114 and 115 are configured to address corresponding datapath functions having limited throughput, as previously described. Additionally, arbiters 113-115 may be configured with priority parameters to select among corresponding FIFOs ready for servicing.

Optionally, output FIFOs, like output FIFO 107 with respect to arbiter 113, may be respectively added between arbiters 114 and 115 and corresponding datapath functions. Accordingly, FIFO 107, as well as one or more added optional FIFOs, may be used to pass one instruction per cycle, namely one token 150, from an associated arbiter into such an added buffer queue, which buffer queue may be a single control token input to an associated downstream datapath function. Moreover, one or more buffer queues may be incorporated into corresponding arbiters, though depicted separately for purposes of clarity and not limitation. However, for purposes of clarity by way of example and not limitation, it shall be assumed that optional output buffer queues are not incorporated or added separately with respect to outputs of arbiters 114 and 115.

At load operation 204, such selected output from arbiter 113 may be loaded into FIFO 107. At operation 204, a codeword token 150 may be output from FIFO 107 for input to tree circuit 131 of datapath pipeline 101 provided, however, tree circuit 131 is ready to receive such input and an output from FIFO 105 is not selected.

A codeword token 150 output from FIFO 107 from instruction interface 124 is an instruction to tree circuit 131 to process a corresponding codeword 120 associated with such a token for tree circuit operation 206. If a codeword token 150 is received by tree circuit 131, tree circuit 131 may access an in-flight or in-process codeword 120, such as codeword 120-7 for example for a codeword token 150-7, from codeword memory 103-1 associated with tree circuit 131. Decode tree circuit operation 206, as well as decode datapath pipeline operations 212, 216, 221, and 226, are examples of possible parts of performing decode operations 220.

Additionally, such parts of performing decode operations 220 may include reads at 232 from memory 103 and stores or writes at 231 to memory 103. Reads at 232 may be destructive reads or may be overwritten by a next codeword. Obtain operations at 207, 213, 217, 222, and 227 are examples of possible parts of reads at 232. Reads 232 may be used to obtain codewords 120, and optionally to obtain associated field information from fields 129. Similarly, store operations at 207, 213, 217, and 222 are examples of possible parts of writes at 231. Optionally, some field information may be concatenated to a token 150 to travel with such token. Optionally, a combination of storing some or all field information in field 129 and some or all field information with a corresponding token 150 in memory 103 may be used.

Assuming 8 codewords 120-0 through 120-7 have been loaded into decoder 100 and processed through tree circuit 131, such codewords 120 may be at different stages of SCL decode processing of such linear block encoded codewords as stored in memories 103. Continuing the above example, codeword memories 103-1 through 103-5 of memories 103 may store respective codewords 120 being processed through datapath pipeline 101 at different points or states of processing thereof. For example, codeword memory 103-1 presently has codeword 120-7 and corresponding fields 129-7; codeword memory 103-2 presently has codewords 120-5 and 120-6 and corresponding fields 129-5 and 129-6; codeword memory 103-3 presently has codeword 120-4 and corresponding fields 129-4; codeword memory 103-4 presently has codewords 120-2 and 120-3 and corresponding fields 129-2 and 129-3; and codeword memory 103-5 presently has codewords 120-0 and 120-1 and corresponding fields 129-0 and 129-1. However, these or other codewords 120, and corresponding fields 129, may be stored in memories 103.

In addition to codewords 120, one or more optional fields 129 corresponding to codewords 120 may be stored along with such corresponding codewords in such memories 103. Examples of fields 129 include a pass count through a datapath pipeline 101 circuit, such as for passes through one or more of circuits 131 through 134. For example, one or more of circuits 131 through 134 may be configured to increment such a field for each pass of a codeword 120-0 through such circuit, and a codeword 120-0 may be stored with or otherwise associated with such field information. Another example of field information for fields 129 may be a pointer to a codeword definition for a codeword. A codeword definition is information as to location of frozen bits and information bits in a codeword.

Assuming a codeword token 150-7 in the above example is input from FIFO 107 to tree circuit 131, tree circuit 131 may process a corresponding codeword 120-7 at 206 and store at operation 207 such a processed codeword 120-7 in codeword memory 103-1. Tree circuit 131 may optionally at 206 be configured to obtain field information 129-7 for such a processed codeword 120-7, and store at 207 such field information 129-7 in association with such processed codeword 120-7 in codeword memory 103-1 or another of memories 103.

Tree circuit 131 may be configured to pass along token 150 at 206 for such processed codeword 120, and provide such token 150 to either FIFO 105 or FIFO 108, depending on SCL processing as generally indicated by a demultiplexer 136 of tree circuit 131, for load operation 208 or 209, respectively. A demultiplexing operation 241 by tree circuit 131 may be used for providing a token to either FIFO 105 or FIFO 108. Again, a codeword 120 and associated token 150 may only exist in one location at a time within memory 103 and queue manager 102, respectively, for an SCL interlaced decoding process of decoder 100.

After a load operation at 208, such FIFO 105 may provide such a loaded token 150 to arbiter 113 to select a queue to service, as between FIFOs 104, 105 and 106, as described below in additional detail. After a load operation at 209, FIFO 108 may have a token 150 ready for arbiter 114.

FIFOs 108 and 109 are for a control circuitry set 122 of buffers, where such control circuitry set 122 further includes an arbiter 114. Control circuitry set 122 in this example is for a decode-update circuit 132 of datapath pipeline 101.

Arbiter 114 may be configured to arbitrate among outputs, if any, ready for output from FIFOs 108 and 109 of control circuitry set 122. At arbitrate or select operation 211, for example after load operation 209, a codeword token 150 may be ready to be read or clocked out of FIFO 108 for input to arbiter 114. Generally, a codeword token 150 to be output of FIFO 109, if any present, and another codeword token 150 for a different codeword to be output of FIFO 108, if any present, may each be ready to be read or clocked respectively out of those FIFOs for servicing of either by arbiter 114.

At select operation 211, a codeword token 150 from FIFO 108 or a different codeword token 150 from FIFO 109 may be selected for servicing by output from arbiter 114 for input to decode-update circuit 132. Again, arbiter 114 may only service one associated incoming queue of associated incoming queues at a time, namely only either FIFO 108 or 109 in this example.

At select operation 211, a codeword token 150 may be output from either a FIFO 108 or 109 for input to decode-update circuit 132 of datapath pipeline 101 provided, however, decode-update circuit 132 is ready to receive such input. A codeword token output from FIFO 108 or 109 from instruction interface 124 is an instruction to decode-update circuit 132 to process a corresponding codeword 120 for decode-update circuit 132 at operation 212.

If a codeword token 150 is received by decode-update circuit 132, decode-update circuit 132 may access an in-flight or in-process codeword 120 associated with such token, such as a codeword 120-5 for example for a codeword token 150-5, from codeword memory 103-2 associated with decode-update circuit 132. Assuming a codeword 120-5 in the above example is read or obtained at 213 from memory 103-2 for a corresponding codeword token 150-5 output from FIFO 109 to arbiter 114 for an instruction to decode-update circuit 132 to read and process same, decode-update circuit 132 may process such a read codeword at 212 and store at operation 213 such a processed codeword in codeword memory 103-2. Decode-update circuit 132 may optionally at 212 be configured to obtain field information 129-5 for such a processed codeword, and store at 213 such field information in association with such processed codeword in codeword memory 103-2 or another of memories 103.

Furthermore, decode-update circuit 132 may be configured to pass along such a token 150 at operation 212 for a just then processed codeword 120, and provide such a token to either FIFO 111 or sort circuit 133, depending on SCL processing as generally indicated by a demultiplexer 137 of decode-update circuit 132, for operation 214 or 216, respectively. A demultiplexing operation 242 by decode-update circuit 132 may be used for providing a token to either FIFO 111 or sort circuit 133.

If operation 214 is invoked for SCL processing, a token 150 provided by decode-update circuit 132 for a just processed codeword may be loaded into FIFO 111. If, however, operation 216 is invoked for SCL processing, a token 150 provided by decode-update circuit 132 for a just processed codeword may be loaded into sort circuit 133 for a sort circuit operation.

Recall that a token may be provided to sort circuit 133 for an information bit, but not a frozen bit. For example, a code rate of 1 and 5, namely 1 information bit for every 5 bits (e.g., generally 1 information bit per 4 frozen bits), may be used. Along those lines, sort circuit 133 may be used on only 1 in every 5 successive passes through SCL decoding loop 155. Accordingly, arbiter 115 may be configured with a fixed priority for FIFO 111, or at least for every 5 passes or so to reduce overall latency.

Conversely, a token 150 passing through sort circuit 133 may be for a codeword 120 closer to being decoded than another in-flight codeword 120, as information bits generally are at the tail end of a codeword. Accordingly to get a decoded codeword 120D out of decoder 100 more quickly, arbiter 115 may be configured to give priority to FIFO 110 over FIFO 111.

In SCL decoding, although order of execution may vary depending upon type of a bit being decoded, operations are executed in sequence, not in parallel. For example, operations may be executed bit-by-bit of a codeword. In other words, though processing of codewords is described for purposes of clarity, such codewords may be processed bit-by-bit. Furthermore, though a radix-2 for one bit per decoding pass in decoder 100 may be used as described herein for purposes of clarity by way of non-limiting example, a radix-r for r an integer greater than two may be used for more than one bit per decoding pass in a decoder 100. For example, a radix of 4 or a radix of 16 may be used, namely processing of 2 or 4 bits per pass, respectively, in a datapath pipeline function. A higher radix value, such as higher than 2, may reduce latency through decoder 100, such as by approximately a factor of 2 or more respectively for a radices of 4 or 16; however, such higher radices increase complexity.

For example, a decode of each codeword bit generally begins with LLR processing. LLR processing may be a next datapath function to execute for these following examples: for the very first bit of a codeword entering a decoder; following a path metric update for a frozen bit; or following a pointer update for a non-frozen bit. These examples mean an LLR processing unit, which in this example is actually in both tree circuit 131 and decode-update circuit 132, may have 3 input queues, one each from these three possible requests. An arbiter feeding an input to an LLR processing unit may be configured to be aware of when such an LLR processing unit is ready to receive/process a codeword. Such an arbiter may be configured to select which of such 3 queues to give priority to. This priority need not be static. For example, a round-robin arbiter may be used for priority, or each queue may have a fixed relative priority with respect to such other 2 queues as configured in an arbiter.

If an upstream datapath function, such as a code-path metric update function of decode-update circuit 132 for example, may be followed by more than one other downstream datapath functions, such as for example either a sort function, or a pointer update and path update function, respectively, of circuits 133 and 134, such an upstream datapath function may issue an instruction to only one of such possible downstream datapath functions.

For a sort circuit 133 ready to receive a token 150 from decode-update circuit 132, sort circuit 133 responsive to a token 150 from decode-update circuit 132 may obtain an in-process codeword, such as for example codeword 120-4 from codeword memory 103-3 for a codeword token 150-4, at 217. If a codeword token 150 is received by sort circuit 133, sort circuit 133 may at operation 217 access an in-flight or in-process codeword 120 associated with such token from codeword memory 103-3 associated with sort circuit 133. Assuming a codeword 120 in the above example is read or obtained at 217 from memory 103-3 for a corresponding codeword token 150 output from decode-update circuit 132 for an instruction to sort circuit 133 to read and process same, sort circuit 133 may process such a read codeword at 216 and store at operation 217 such a processed codeword in codeword memory 103-3. Sort circuit 133 may optionally at 216 be configured to obtain field information 129 for such a processed codeword 120, and store at 217 such field information 129 in association with such processed codeword in codeword memory 103-3.

Sort circuit 133, after processing such codeword 120 at 216 may pass such a corresponding token 150 to FIFO 110 for loading at load operation 218. Such a token 150 may subsequently be passed to arbiter 115 for subsequent decoding cycle. If, however, a codeword token 150 is received by FIFO 111 from decode-update circuit 132 at load operation 214, such a codeword token may be subsequently passed to arbiter 115 without going through sort circuit 133 for a decoding cycle.

FIFOs 110 and 111 are for a control circuitry set 123 of buffers, where such control circuitry set 123 further includes an arbiter 115. Control circuitry set 123 in this example is for a pointer-path circuit 134 of datapath pipeline 101.

Arbiter 115 may be configured to arbitrate among outputs, if any, ready for output from FIFOs 110 and 111 of control circuitry set 123. At arbitrate or select operation 219, for example after load operation 214 and/or 218, a codeword token 150 may be ready to be read or clocked out of FIFO 111 or 110, respectively, for input to arbiter 115. Generally, a codeword token 150 to be output of FIFO 110, if any present, and another codeword token 150 for a different codeword to be output of FIFO 111, if any present, may each be ready to be read or clocked respectively out of those FIFOs for servicing of either by arbiter 115.

At select operation 219, a codeword token 150 from FIFO 110 or a different codeword token 150 from FIFO 111 may be selected for servicing by output from arbiter 115 for input to pointer-path circuit 134. Again, arbiter 115 may only service one associated incoming queue of associated incoming queues at a time, namely only either FIFO 110 or 111 in this example.

At select operation 219, a codeword token 150 may be output from either a FIFO 110 or 111 for input to pointer-path circuit 134 of datapath pipeline 101 provided, however, pointer-path circuit 134 is ready to receive such input. A codeword token 150 output from FIFO 110 or 111 from instruction interface 124 is an instruction to pointer-path circuit 134 to process a corresponding codeword 120 by pointer-path circuit 134 at operation 221.

If a codeword token 150 is received by pointer-path circuit 134, pointer-path circuit 134 may access an in-flight or in-process codeword 120 from codeword memory 103-4 associated with pointer-path circuit 134, where such in-process codeword 120 is associated with such a token 150, such as for example a codeword 120-2 for a codeword token 150-2. Assuming a codeword 120-2 in the above example is read or obtained at 222 from memory 103-4 for a corresponding codeword token 150-2 output from FIFO 110 or 111 to arbiter 115 for an instruction to pointer-path circuit 134 to read and process same, pointer-path circuit 134 may process such a read codeword at 221 and store at operation 222 such a processed codeword in codeword memory 103-4. Optionally, pointer-path circuit 134 may be configured to obtain field information 129-5 at operation 221 for such a processed codeword, and at operation 222 store such field information obtained in association with such processed codeword in codeword memory 103-4 or another of memories 103.

Furthermore, pointer-path circuit 134 may be configured to pass along such a token 150 at operation 221 for a just then processed codeword 120, and provide such a token to one of FIFOs 106, 109, or 112 for a load operation of load operations 223, 224, or 225, respectively, depending on SCL processing as generally indicated by a demultiplexer 138 of pointer-path circuit 134. A demultiplexing operation 243 by pointer-path circuit 134 may be used for providing a token to either of FIFOs 106, 109, or 112 for a load operation of load operations 223, 224, or 229, respectively.

If operation 223 is invoked for SCL processing, a token 150 provided by pointer-path circuit 134 for a just processed codeword may be loaded into FIFO 106 for subsequent selection by arbiter 113 at select operation 203. Again, an arbitrate and select operation may be to arbitrate among different tokens 150 respectively in two or more of FIFOs 104 through 106 for selection of one of such tokens 150.

Because select operations 203, 211, and/or 219 may each have more than one codeword token 150 waiting to be serviced out of a FIFO associated with different codewords 120, downstream circuitry may have a high utilization rate. While traffic collisions may occur, such collisions result in delay and not loss of data. Moreover, even though traffic collision may occur, high a utilization rate of resources may be obtained for datapath pipeline 101 circuit resources.

If operation 224 is invoked for SCL processing, a token 150 provided by pointer-path circuit 134 for a just processed codeword may be loaded into FIFO 109 for subsequent selection by arbiter 114 at select operation 211. Again, an arbitrate and select operation may be to arbitrate among different tokens 150 respectively in both of FIFOs 108 and 109 for selection of one of such tokens 150.

If operation 229 is invoked for SCL processing, a token 150 provided by pointer-path circuit 134 for a just processed codeword may be loaded into FIFO 112 for subsequent output therefrom for decode-end circuit 135 processing at operation 226. At operation 227, an in-decoding-process version of a codeword 120 may be obtained from memory 103-5 for decode-end circuit 135 processing operation 226. Output at 226 from decode-end circuit 135 may be a decoded codeword 120D, as well as a corresponding token 150, as a possible example of output operation 225. Such token 150 may be returned to decrement a count at count operation 228. Accordingly, each of interlaced codewords 120 may be pipelined decoded through datapath pipeline 101 for outputting corresponding decoded versions of such codewords 120 as decoded codewords 120D one at a time.

Latency of queue manager 102 may be hidden to some extent by having datapath functions receive "just-in-time" instructions as tokens immediately passed from a queue to a datapath function for immediate processing of an associated codeword. In other words, an instruction can be issued such that when a datapath function receives such instruction, codeword or other data associated with that instruction, which such datapath function uses, may just be available in time to begin execution. This pre-emptive instruction issuing ensures that latency of decoder 100 may be limited by datapath pipeline 101 and not by a fixed minimum latency of control queues. Latency of decoder 100 may still be limited to some extent by delays incurred by traffic collisions, where a codeword is held pending a successful arbitration to service a queue holding such codeword. Additionally, because each codeword can exist in only one place in a decode cycle of datapath functions and queues in decoder 100, a codeword may be terminated simply by exiting or returning an instruction token 150 to up/down counter 160. For example, termination may occur by dropping a token 150, and passing such dropped token to up/down counter or scheduler 160 in order to respectively decrement such counter or deallocate memory and an associated slot for an in-flight codeword 120 associated with such dropped token 150. Along those lines, an in-flight vector or codeword 120 may in effect be modified to have a zero in a corresponding slot for such codeword identifier.

Though an example of a datapath pipeline 101 was shown, there are several different examples for an instruction token passing between a datapath function 'A' and a next datapath function 'B' for SLC decoding. For example, where a datapath function 'A' is always followed by a same datapath function 'B', where datapath function 'B' can always accept input requests immediately, there is no need for queuing of instructions between datapath functions 'A' and 'B'. In this example, datapath functions 'A' and 'B' may be combined. More concretely, psum calculations and LLR processing may be combined, because a psum calculation is always followed by LLR processing. In the example of datapath pipeline 101, a psum calculation is incorporated into LLR processing blocks, namely tree circuit 131 and pointer-path circuit 134 (i.e., tree and decode).

Another example is where a datapath function 'A' may be followed by more than one possible datapath function, such as either datapath function 'B' or datapath function 'C'. In the example of datapath pipeline 101, decode-update circuit 132, in this example datapath function 'A', issues an instruction to only one of two possible paths, namely either a sort circuit 133, in this example possible destination datapath function 'B', or pointer-path circuit 134, in this example possible destination datapath function 'C', (i.e., sort or pointer update for a decode).

Yet another example is where a datapath function 'B' can always accept a new block immediately, then an instruction queue between datapath functions 'A' and 'B' may be omitted. For example, there is no queue or FIFO directly between decode-update circuit 132 and sort circuit 133.

Still yet another example is where datapath function 'B' can accept data immediately, but there is more than one datapath function 'A', a queue per datapath function 'A' is used, and an arbiter is used. An example of this in datapath pipeline 101 is where sort circuit 133, namely datapath function 'A1', and decode-update circuit 132 (i.e., a decode), namely datapath function 'A2' can each send instructions to pointer-path circuit 134 (i.e. a pointer update), namely datapath function 'B'. Accordingly, FIFOs 110 and 111 are respectively located between an arbiter 115 and circuits 133 and 134, with output of such arbiter 115 feeds an input to pointer-path circuit 134.

Further still yet another example is where a datapath function 'B' cannot accept data immediately from a datapath function 'A', and input queue is used. Along those lines, decode-end circuit 135, namely such a datapath function 'B', may be a pacing datapath function with respect to pointer-path circuit 134, namely datapath function 'A', of datapath pipeline 101. Accordingly, in-flight codewords may be queued up in FIFO 112 for subsequent processing by decode-end circuit 135.

Yet further still another example is where there are multiple datapath functions 'A' which can call a single datapath function 'B' which cannot accept instructions immediately, a queue is used for each source datapath function 'A', and an arbiter is used. Such an arbiter may operate in one of two ways: such arbiter may service one of such datapath function 'A' queues only when datapath function 'B' is ready to accept input; or such arbiter may service one of such datapath function 'A' queues to feed into a further queue which datapath function 'B' services when ready. This latter configuration is shown in datapath pipeline 101 with respect to possible input sources to tree circuit 131, namely datapath function 'B', where instructions can be sourced through queues and an arbiter 113 from any of three datapath sources, namely tree circuit 131 itself, pointer-path circuit 134, or from an initial input (i.e., start of decode for a block).

FIG. 3 is a block diagram depicting an exemplary communication system 300 in which decoder 100 of FIG. 1 may be used. Communication system 300 may include a transmitter 301 in communication with a receiver 303 via one or more communication channels 302.

Transmitter 301 may include a cyclic-redundancy-check ("CRC") inserter 311, a parity and frozen bits inserter 312, and a polar encoder 313. In this example, K bits of information may be accepted by CRC inserter 311 to provide K+L bits to parity and frozen bits inserter 312. Parity and frozen bits inserter 312 may add parity and frozen bits to such K+L bits to provide N bits to polar encoder 313. Polar encoder 313 may output a codeword 120 as N soft bits, namely N LLRs, for transmission via one or more communication channels 302 to decoder 100 of receiver 303. Decoder 100 may be configured, as previously described, to decode such codeword 120 to provide a decoded codeword 120D as K decoded ("$K_D$") hard decision bits.

Decoder 100 may be provided as a hardwired ASIC in an IC, or may be provided as a softcore in a coded language, such as may be instantiated in an FPGA or other IC with programmably configurable circuit resources. Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 4:
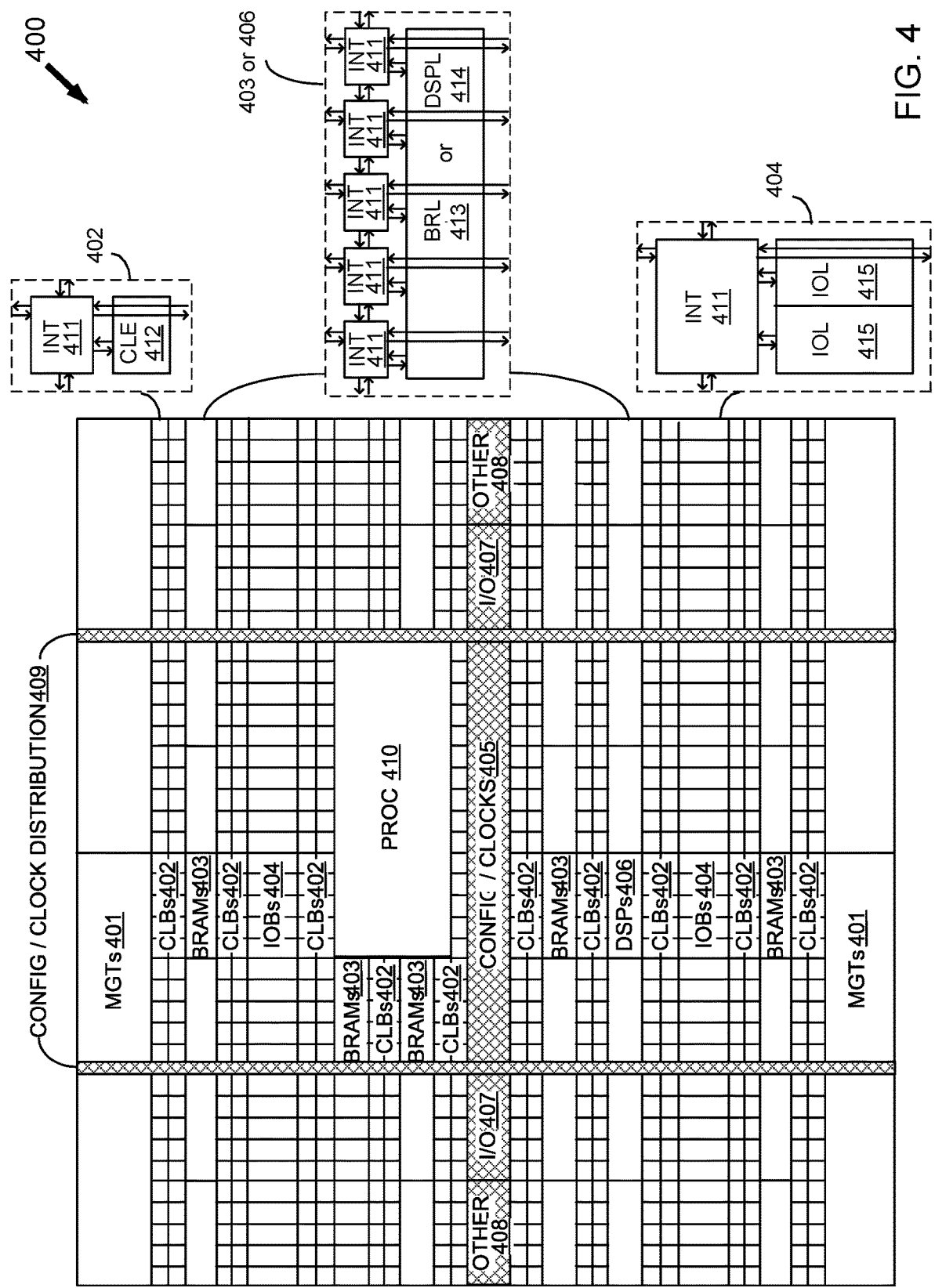
FIG. 4 is a simplified block diagram depicting an exemplary columnar Field Programmable Gate Array ("FPGA") architecture.

As noted above, advanced FPGAs can include several different types of programmable logic blocks in the array. For example, FIG. 4 illustrates an FPGA architecture 400 that includes a large number of different programmable tiles including multi-gigabit transceivers ("MGTs") 401, configurable logic blocks ("CLBs") 402, random access memory blocks ("BRAMs") 403, input/output blocks ("IOBs") 404, configuration and clocking logic ("CONFIG/CLOCKS") 405, digital signal processing blocks ("DSPs") 406, specialized input/output blocks ("I/O") 407 (e.g., configuration ports and clock ports), and other programmable logic 408 such as digital clock managers, analog-to-digital converters, system monitoring logic, and so forth. Some FPGAs also include dedicated processor blocks ("PROC") 410.

In some FPGAs, each programmable tile includes a programmable interconnect element ("INT") 411 having standardized connections to and from a corresponding interconnect element in each adjacent tile. Therefore, the programmable interconnect elements taken together implement the programmable interconnect structure for the illustrated FPGA. The programmable interconnect element 411 also includes the connections to and from the programmable logic element within the same tile, as shown by the examples included at the top of FIG. 4.

For example, a CLB 402 can include a configurable logic element ("CLE") 412 that can be programmed to implement user logic plus a single programmable interconnect element ("INT") 411. A BRAM 403 can include a BRAM logic element ("BRL") 413 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 406 can include a DSP logic element ("DSPL") 414 in addition to an appropriate number of programmable interconnect elements. An 10B 404 can include, for example, two instances of an input/output logic element ("IOL") 415 in addition to one instance of the programmable interconnect element 411. As will be clear to those of skill in the art, the actual I/O pads connected, for example, to the I/O logic element 415 typically are not confined to the area of the input/output logic element 415.

In the pictured embodiment, a horizontal area near the center of the die (shown in FIG. 4) is used for configuration, clock, and other control logic. Vertical columns 409 extending from this horizontal area or column are used to distribute the clocks and configuration signals across the breadth of the FPGA.

Some FPGAs utilizing the architecture illustrated in FIG. 4 include additional logic blocks that disrupt the regular columnar structure making up a large part of the FPGA. The additional logic blocks can be programmable blocks and/or dedicated logic. For example, processor block 410 spans several columns of CLBs and BRAMs.

Note that FIG. 4 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 4 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

FIG. 5 is a pseudocode listing depicting an exemplary arbiter and queue 500. Arbiter and queue 500 is further described with simultaneous reference to FIGS. 1 and 5.

An arbiter of arbiter and queue 500 may be an example of arbiter 115; however, other examples of arbiters 113 and 114 follow from this example, and thus are not described in unnecessary detail for purposes of clarity and not limitation. In this example, a token 'a' is given priority over token 'b', and if there is no token 'a' ready to be serviced, then token 'b' is serviced.

Figure 6:
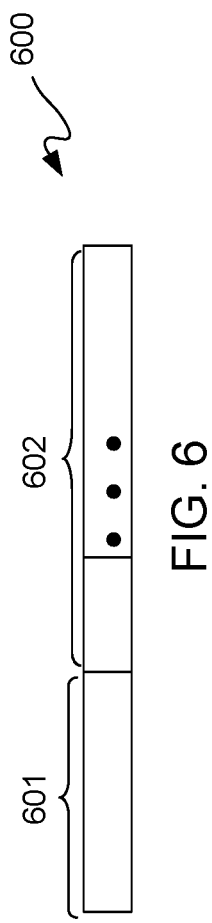
FIG. 6 is a block diagram depicting an exemplary token.

FIG. 6 is a block diagram depicting an exemplary token 600. Token 600 is further described with simultaneous reference to FIGS. 1 and 6.

Token 600 may be an example of a token 150. Token 600 includes a codeword identifier field 601. Codeword identifier field 601 identifies an associated codeword. In the above example, codeword identifier field 601 may be a multiple bit field to cover limit M, such as for example a three-bit field for numbers 0 through 7 to cover 8 slots for limit M. Token 600 may optionally include one or more additional fields 602. Such one or more additional fields 602 may be fields 129, as previously described, which fields may be for storing field information. Optionally, one or more additional fields 602 may be avoided by using codeword identifier field 601 as an index into a codeword store in memory 103 in order to obtain field information from fields 129. Optionally, a combination of one or more additional fields 602 and using codeword identifier field 601 as an index into a codeword store in memory 103 may be used.

Figure 7:
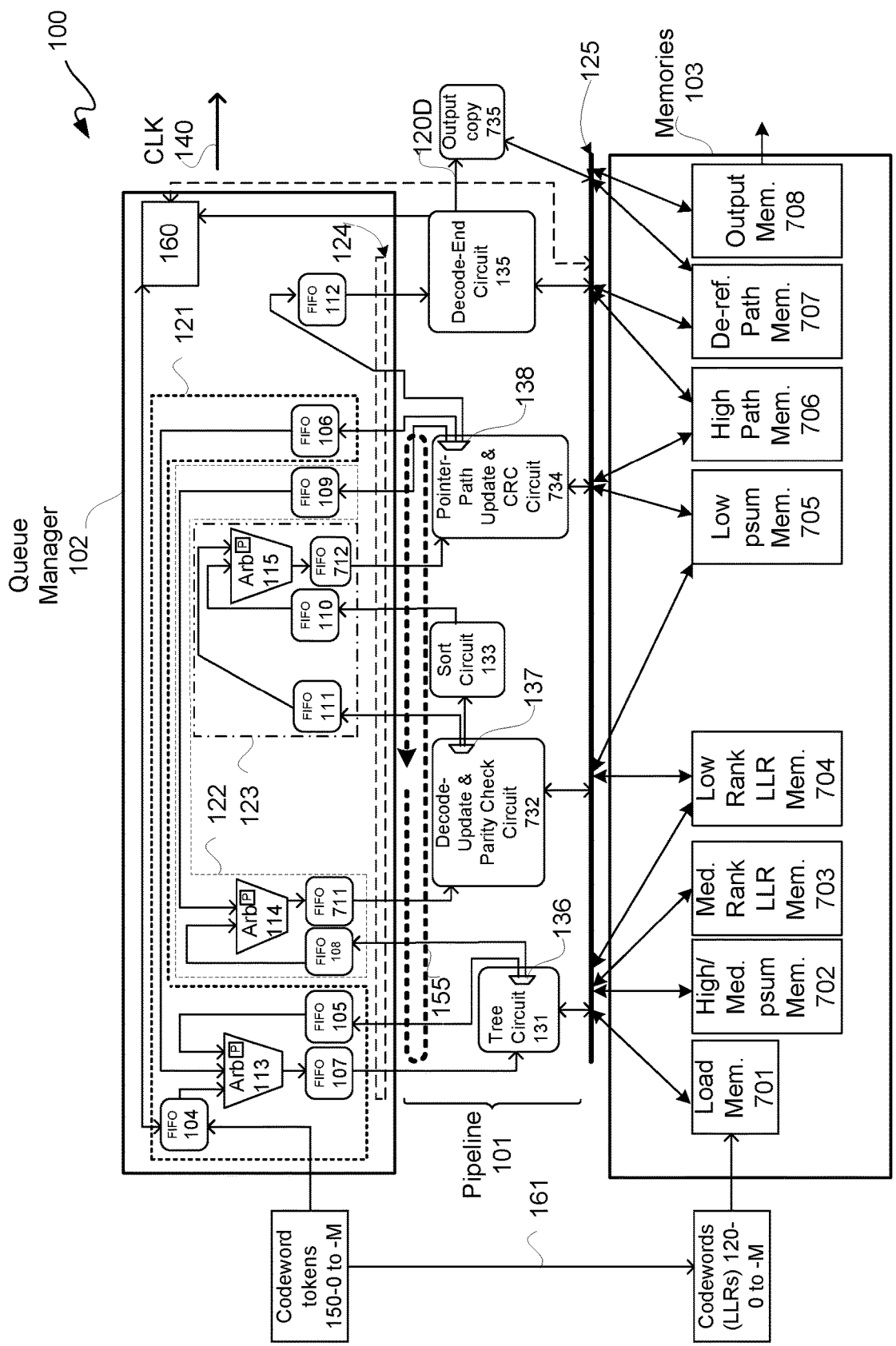
FIG. 7 is a block diagram depicting another exemplary data processing kernel, such as for decoding for example.

FIG. 7 is a block diagram depicting another exemplary data processing kernel 100. Again, data processing kernel 100 of FIG. 7 is described for purposes of clarity by way of non-limiting example as a decoder 100. Much of decoder 100 of FIGS. 1 and 7 is the same, and so generally same description is not repeated for purposes of clarity and not limitation.

In decoder 100 of FIG. 7, output FIFOs 711 and 712 are coupled to receive output from arbiters 114 and 115, respectively. Output from FIFOs 711 and 712 are respectively provided as inputs to decode-update circuit 732 and pointer-path circuit 734. Effectively, FIFOs 711 and 712 may be input buffers respectively for circuits 732 and 734. Circuits 732 and 734 are more complicated than before, and thus may not be fully pipelined.

In this example, sort circuit 133 is not directly coupled to memory 103 through memory bus 125. Moreover, memories 701 through 707 directed to SCL decoding are particularly described. Codewords or LLRs 120 may be loaded into load memory 701 for access by tree circuit 131. Tree circuit 131 may further be in communication with high/medium psum memory 702 to store high and medium psum values therein. Tree circuit 131 may be in communication with medium rank LLR memory 703 to store medium rank LLRs therein.

Generally, tree circuit 131 may provide low rank LLRs to low rank LLR memory 704 for decode-update circuit 732. Decode-update circuit 732 is the same as decode-update circuit 132 with addition of conventional parity check circuitry. Decode-update circuit 732 may obtain low psums from low psum memory 705.

Low psums may be provided to low psum memory 705 from pointer-path circuit 734. Pointer-path circuit 734 may be the same as pointer-path circuit 134 with addition of conventional CRC circuitry.

Pointer-path circuit 734 may provide high path values to high path memory 706. Decode-end circuit 135 may obtain high path values from high path memory 706 and provide de-referenced path information to de-referenced path memory 707.

In this example, datapath pipeline 101 may include an output copy circuit 735 coupled to receive decoded codewords 120D from decode-end circuit 135. Output copy circuit 735 may be coupled though memory bus 125 to receive de-referenced path information from de-referenced path memory 707. Output copy circuit 735 may be coupled to output memory 708 for storing decoded codewords 120D with de-referenced path information in output memory 708 for reading out of memory 103.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A data processing kernel, comprising:
a datapath pipeline configured to process a plurality of datasets interlaced with respect to one another for multiple passes through a loop, the datapath pipeline having datapath functions associated with conditional or data dependent decision points;
a queue manager configured with a plurality of control circuitry sets to provide an instruction interface to the datapath pipeline, each of the plurality of control circuitry sets comprising:
a first buffer and a second buffer each configured to buffer a plurality of tokens corresponding to the plurality of datasets; and
an arbiter configured to decouple the conditional or data dependent decision points from the datapath pipeline to selectively provide access of the first buffer or the second buffer to the datapath functions; and
memory configured to provide access to and storage of the plurality of datasets to the datapath functions.

2. The data processing kernel according to claim 1, wherein:
the datapath pipeline comprises a first log-likelihood ratio processing circuit and a second log-likelihood ratio processing circuit;
a first control circuitry set of the plurality of control circuitry sets is configured for providing input serially to the first log-likelihood ratio processing circuit;
a second control circuitry set of the plurality of control circuitry sets is configured for providing input in parallel to the second log-likelihood ratio processing circuit;
each of the plurality of tokens is a unique instance within the datapath pipeline for one-to-one correspondences with the datasets; and
the arbiter of each of the plurality of control circuitry sets is configured with a priority parameter.

3. The data processing kernel according to claim 2, wherein:
the priority parameter is selected from a fixed priority, a first-in-time priority, a further along in processing priority, or a round-robin priority;
the data processing kernel is a decoder;
the plurality of datasets is a plurality of codewords representing groupings of linear block code encoded bits; and
the datapath pipeline is configured to process the plurality of codewords for a Successive Cancellation decoding.

4. The decoder according to claim 3, wherein the datapath pipeline further comprises:
a sort circuit;
a pointer-path circuit;
decode-end circuit;
the first log-likelihood ratio processing circuit as a tree circuit; and
the second log-likelihood ratio processing circuit as a decode-update circuit.

5. The decoder according to claim 4, wherein the first buffer and the second buffer of each of the plurality of control circuitry sets is a first first-input, first-output buffer ("FIFO") and a second FIFO, respectively.

6. The decoder according to claim 4, wherein:
the plurality of codewords includes a plurality of polar code encoded codewords;
the datapath pipeline is configured to process the plurality of codewords for Successive Cancellation List decoding;
the first buffer of the second control circuitry set is configured to receive a first token output from the tree circuit;
the second buffer of the second control circuitry set is configured to receive a second token output from the pointer-path circuit;
the arbiter of the second control circuitry set is configured to select the first token from the first buffer or the second token from the second buffer of the second control circuitry set;
wherein the tree circuit is configured to demultiplex the first token to the first buffer of either the first or second control circuitry set; and wherein the pointer-path circuit is configured to demultiplex the second token to the second buffer of either the first or second control circuitry set.

7. The decoder according to claim 6, further comprising:
a third buffer of the queue manager coupled between the pointer-path circuit and the decode-end circuit; and
wherein the pointer-path circuit is configured to demultiplex the second token to either the second buffer of either the first or second control circuitry set or the third buffer.

8. The decoder according to claim 6, wherein the first control circuitry set further comprises:
a third buffer configured to buffer the plurality of tokens for input to the decoder and respective passage to the arbiter; and
a fourth buffer coupled between an output of the arbiter and an input of the tree circuit to buffer access to the tree circuit.

9. The decoder according to claim 4, wherein a third control circuitry set of the plurality of control circuitry sets comprises:
the first buffer configured to receive a first token output from the decode-update circuit;
the second buffer configured to receive a second token output from the sort circuit;
the arbiter configured to select the first token from the first buffer or the second token from the second buffer; and
wherein the decode-update circuit is configured to demultiplex the first token to either the first buffer of the third control circuitry set or the sort circuit.

10. The decoder according to claim 3, further comprising a control circuit configured to limit the plurality of codewords to a maximum interlaced number.

11. A method for processing data, comprising:
queuing, by a plurality of control circuitry sets, a plurality of tokens in a queue manager of a data processing kernel configured in hardware for multiple passes through a loop for a datapath pipeline having datapath functions associated with conditional or data dependent decision points;
loading, by a sort circuit, a plurality of datasets corresponding to the plurality of tokens into memory of the data processing kernel;
selectively passing, by the plurality of control circuitry sets, the plurality of tokens from the queue manager to the datapath pipeline of the data processing kernel as corresponding instructions, the selectively passing including:
arbitrating between a first buffer and a second buffer by an arbiter of a control circuitry set of the plurality of control circuitry sets of the queue manager to decouple the conditional or data dependent decision points from the datapath pipeline by selective access of the first buffer or the second buffer to the datapath pipeline to allow each of the plurality of tokens to respectively pass for input to the datapath pipeline;
performing, by the queue manager, the multiple passes through the loop in the datapath pipeline responsive to the instructions for the plurality of datasets interlaced in the data processing kernel; and
outputting, by the datapath pipeline, a processed version of each of the plurality of datasets.

12. The method according to claim 11, wherein the performing of the multiple passes through the loop comprises reading the plurality of datasets from the memory for the performing of the multiple passes through the loop.

13. The method according to claim 11, wherein the performing of the multiple passes through the loop comprises storing in-process versions of the plurality of datasets in the memory for the multiple passes through the loop.

14. The method according to claim 11, further comprising limiting the plurality of datasets in the data processing kernel at one time to a maximum number.

15. The method according to claim 11, wherein:
the plurality of tokens are unique instances with respect to one another within the datapath pipeline and the queue manager for one-to-one correspondence with the plurality of datasets interlaced within the data processing kernel; and
the arbiter of each of the plurality of control circuitry sets is configured with a priority parameter.

16. The method according to claim 15, wherein:
the priority parameter is selected from a fixed priority, a first-in-time priority, a further along in processing priority, or a round-robin priority;
the data processing kernel is a decoder;
the plurality of datasets is a plurality of codewords representing groupings of linear block code encoded bits; and
the performing of the multiple passes through the loop are for decode operations for a Successive Cancellation decoding.

17. The method according to claim 16, wherein the plurality of codewords includes a plurality of polar code encoded codewords.

18. The method according to claim 17, further comprising demultiplexing from a tree circuit of the datapath pipeline a token to either a first buffer or a second buffer of the queue manager for a Successive Cancellation List decoding.

19. The method according to claim 17, further comprising:
demultiplexing from a decode-update circuit of the datapath pipeline a token to either a first buffer of the queue manager or a sort circuit of the datapath pipeline; and
passing the token to a second buffer of the queue manager from the sort circuit for the demultiplexing of the token to the sort circuit.

20. The method according to claim 17, further comprising demultiplexing from a pointer-path circuit of the datapath pipeline a token to either a first buffer, a second buffer, or a third buffer of the queue manager for a Successive Cancellation List decoding.

* * * * *